US009356029B2

(12) United States Patent
Oh et al.

(10) Patent No.: US 9,356,029 B2
(45) Date of Patent: May 31, 2016

(54) SEMICONDUCTOR DEVICE HAVING BURIED GATE, METHOD OF FABRICATING THE SAME, AND MODULE AND SYSTEM HAVING THE SAME

(71) Applicant: SK hynix Inc., Icheon (KR)

(72) Inventors: Tae Kyung Oh, Yongin (KR); Min Soo Yoo, Yongin (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/712,860

(22) Filed: May 14, 2015

(65) Prior Publication Data
US 2015/0263009 A1    Sep. 17, 2015

Related U.S. Application Data

(62) Division of application No. 13/719,002, filed on Dec. 18, 2012, now Pat. No. 9,064,956.

(30) Foreign Application Priority Data

Aug. 31, 2012  (KR) .................. 10-2012-0096488

(51) Int. Cl.
*H01L 27/08* (2006.01)
*H01L 27/108* (2006.01)
*H01L 29/78* (2006.01)
*H01L 29/66* (2006.01)
*G11C 11/4091* (2006.01)
*H01L 29/94* (2006.01)
*H01L 29/423* (2006.01)
(Continued)

(52) U.S. Cl.
CPC ...... *H01L 27/10876* (2013.01); *G11C 11/4091* (2013.01); *H01L 21/265* (2013.01); *H01L 21/28035* (2013.01); *H01L 21/28079* (2013.01); *H01L 21/28088* (2013.01); *H01L 21/30604* (2013.01); *H01L 21/32133* (2013.01); *H01L 29/4236* (2013.01); *H01L 29/66666* (2013.01); *H01L 29/7827* (2013.01); *H01L 29/945* (2013.01); *G11C 11/404* (2013.01); *G11C 2211/4068* (2013.01)

(58) Field of Classification Search
CPC ............... H01L 29/7827; H01L 29/66666; H01L 29/945; H01L 29/4236; H01L 27/10786; H01L 21/32133; H01L 21/30604; H01L 21/28088; G11C 11/4091; G11C 11/404; G11C 2211/4068
USPC .......... 438/589, 587, 588, 270, 592; 257/330, 257/331, E21.616, E27.06; 365/182, 149, 365/185.18
See application file for complete search history.

(56) References Cited

U.S. PATENT DOCUMENTS

| 5,945,719 | A  | * | 8/1999 | Tsuda | ............... H01L 21/28061 257/412 |
| 8,173,506 | B2 | * | 5/2012 | Jung | ................... H01L 29/4236 257/E29.201 |
| 2010/0044797 | A1 | * | 2/2010 | Lee | ................... H01L 29/42376 257/366 |
| 2010/0240184 | A1 | * | 9/2010 | Jung | ................... H01L 29/4236 438/270 |

(Continued)

FOREIGN PATENT DOCUMENTS

| KR | 10-2009-0081615 A | 7/2009 |
| KR | 10-2010-0106112 A | 10/2010 |
| KR | 10-2011-0130158 A | 12/2011 |

*Primary Examiner* — Thinh T Nguyen

(57) ABSTRACT

A semiconductor device includes junction regions formed in upper portions of both sidewalls of a trench formed in a semiconductor substrate, a first gate electrode buried in the trench and having a stepped upper surface, and a second gate electrode formed on the first gate electrode to overlap a junction region.

12 Claims, 16 Drawing Sheets

(51) Int. Cl.
*H01L 21/265* (2006.01)
*H01L 21/28* (2006.01)
*H01L 21/306* (2006.01)
*H01L 21/3213* (2006.01)
*G11C 11/404* (2006.01)

(56) References Cited

U.S. PATENT DOCUMENTS

2012/0045892 A1* 2/2012 Sengoku ........... H01L 21/28079
438/592

* cited by examiner

SEMICONDUCTOR DEVICE HAVING BURIED GATE, METHOD OF FABRICATING THE SAME, AND MODULE AND SYSTEM HAVING THE SAME

CROSS-REFERENCES TO RELATED APPLICATION

The present application is a divisional of U.S. application Ser. No. 13/719,002 filed on Dec. 18, 2012, which claims priority under 35 U.S.C. 119(a) to Korean application number 10-2012-0096488, filed on 31 Aug. 2012, in the Korean Patent Office, which are incorporated by reference in their entirety.

BACKGROUND OF THE INVENTION

1. Technical Field

The present invention relates to a buried gate type semiconductor device, a method of fabricating the same, and a module and system having the same, and more particularly, to technology related to improving gate-induced drain leakage (GIDL) and reducing a gate resistance, and thus improving device characteristics and reliability.

2. Related Art

Demand for higher capacity memory such as dynamic random access memories (DRAM) continues to increase while the size available for memory in many devices decreases or remains the same. Therefore, recent endeavors have focused on reducing a cell area by changing a cell layout to integrate more many memory cells on one wafer.

Buried gate structures have been developed as a result of these endeavors. In buried gate structures, a leakage current is increased by GIDL between a conductive material (gate electrode) and an N type junction of an active region or between the conductive material and a storage node contact, and consequently refresh characteristics such as a refresh period (tREF) of the semiconductor device are degraded.

To prevent the leakage current from being increased due to the GIDL, the conductive material (gate electrode) of the buried gate can be over-etched to minimize an overlapping area between the storage node contact and the gate conductive material (gate electrode).

However, while over-etching the conductive material (gate electrode) of the buried gate can reduce leakage current, it also causes the speed and current driving capability of the semiconductor device to be lowered and write-recovery time (TWR) to be degraded due to an increase in resistance of the buried gate.

SUMMARY

Embodiments of the present invention may improve GIDL and prevent device characteristics and reliability from being degraded by reducing resistance in a buried gate. According to one aspect of an embodiment, a semiconductor device is provided. The semiconductor device may include: a semiconductor substrate having a trench, the trench having first and second sidewalls; junction regions disposed in upper portions of the first and second sidewalls of the trench; a first gate electrode with a stepped upper surface buried in the trench; and a second gate electrode disposed over the first gate electrode to overlap the junction regions.

The semiconductor device may further include a barrier layer interposed between the first gate electrode and the second gate electrode. The barrier layer comprises a metal and nitrogen.

The gate electrode has a symmetrical stepped structure in which an upper surface of side portions of the first gate electrode is lower than an upper surface of a central portion of the first gate electrode between the side portions.

An upper surface of the first gate electrode includes two steps so that a central portion protrudes above two side portions, the two side portions do not to substantially overlapping the junction regions, the central portion overlapping the junction regions.

An upper surface of the first gate electrode has a single step so that an upper surface the gate electrode that is adjacent to a storage node contact has a lower height than an upper surface of the gate electrode that is adjacent to a bit line contact.

The junction regions include a bit line contact junction region and a storage node contact junction region, the first gate electrode having a first upper surface which overlaps the bit line contact junction region, and a second upper surface which is disposed below the storage node contact junction region. The first gate electrode includes metal and the second gate electrode includes polysilicon. The first gate electrode includes a stacked structure of barrier metal and tungsten (W).

According to another aspect of an embodiment, there is provided a method of fabricating a semiconductor device. The method may include: etching a gate region of a semiconductor substrate to form a trench; forming a first gate electrode in the trench; etching at least one side portion of the first gate electrode to a first depth; and forming a second gate electrode on the first gate electrode; forming a first junction region on a first side of the second gate and a second junction region on a second side of the second gate.

The step of etching at least one side portion of the first gate electrode to a first depth includes symmetrically etching the first gate electrode so that upper surfaces of the first and second side portions of the first gate electrode adjacent to the first and second junction regions have a lower height than an upper surface of a central portion between the first and second side portions.

The step of etching at least one side portion of the first gate electrode to a first depth includes etching the first gate electrode so that upper surfaces of side portions adjacent to the first and second junction regions are below the first and second junction regions and an upper surface of a central portion of the first gate electrode between the first and second side portions has a height sufficient to overlaps the junction regions.

The step of etching at least one side portion of the first gate electrode to a first depth includes asymmetrically etching the first gate electrode so that an upper surface of a portion of the gate first gate electrode adjacent to a storage node contact is lower than an upper surface of a portion of the first gate electrode adjacent to a bit line contact.

The step of etching at least one side portion of the first gate electrode to a first depth includes etching the first gate electrode so that an upper surface of a portion of the gate first gate electrode adjacent to a storage node contact is disposed below the first junction region, an upper surface of a portion of the gate first gate electrode overlaps the second junction region, and the second junction region is a bit line contact junction region. The method may further include forming a gate insulating layer in the trench before the step of forming the first gate electrode.

The step of forming the first gate electrode includes forming a barrier metal layer on the gate insulating layer and forming a first gate material over the barrier metal layer in the trench to form the first gate electrode.

The step of etching at least one side portion of the first gate electrode to a first depth includes etching at least one side portion of the barrier metal layer when the at least one side portion of the first gate electrode is etched. The method may further include forming a barrier layer on the first gate electrode before the step of forming the second gate electrode.

The step of forming a barrier layer includes implanting nitrogen ions into an upper portion of the first gate electrode. The method step of forming a barrier layer includes forming a metal layer containing nitrogen. The first gate electrode includes metal and the second gate electrode includes polysilicon.

According to another aspect of an embodiment, there is provided a semiconductor device. The semiconductor device may include: a cell array including a plurality of cells, the cell being coupled to word lines and bit lines; a sense amplifier coupled to the bit lines and configured to sense data stored in the cells; a row decoder coupled to buried gates of cells and configured to generate a signal for activating the cells; and a column decoder configured to generate a driving signal for operating the sense amplifier coupled to a cell selected by the row decoder, wherein each of the cells includes: first and second junction regions formed in upper portions of first and second sidewalls of a trench in a semiconductor substrate, a first gate electrode buried in the trench and having a stepped upper surface, and a second gate electrode disposed over the first gate electrode and including a lower portion that overlaps the first junction region.

According to another aspect of an embodiment, there is provided a semiconductor module including a plurality of semiconductor devices mounted on a board. Each of the semiconductor devices may include: first and second junction regions in upper portions of both sidewalls of a trench formed in a semiconductor substrate; a first gate electrode buried in the trench and having a stepped upper surface; and a second gate electrode formed on the first gate electrode and including a lower portion that overlaps the first junction region.

According to another aspect of an embodiment, there is provided a semiconductor system including a semiconductor module including a plurality of semiconductor devices mounted on a board; and a controller configured to control an operation of the semiconductor module, wherein each of the semiconductor devices includes: first and second junction regions formed in upper portions of both sidewalls of a trench formed in a semiconductor substrate, a first gate electrode buried in the trench and having a stepped upper surface, and a second gate electrode formed on the first gate electrode and including a lower portion that overlaps the first junction region.

According to another aspect of an embodiment, there is provided a computer system including a semiconductor system having at least one semiconductor module; and a processor configured to process data stored in the semiconductor system, wherein the semiconductor module includes a plurality of semiconductor devices mounted on a board, and wherein each of the plurality of semiconductor devices includes: first and second junction regions formed in upper portions of both sidewalls of a trench formed in a semiconductor substrate, a first gate electrode buried in the trench and having a stepped upper surface, and a second gate electrode formed on the first gate electrode and including a lower portion that overlaps the first junction region.

According to another aspect of an embodiment, there is provided a data processing system including at least one semiconductor device mounted on a board. The semiconductor device may include: first and second junction regions formed in upper portions of both sidewalls of a trench formed in a semiconductor substrate; a first gate electrode buried in the trench and having a stepped upper surface; and a second gate electrode formed on the first gate electrode and including a lower portion that overlaps the first junction region.

According to another aspect of an embodiment, there is provided an electronic system including at least one data processing system. The data processing system may include at least one semiconductor device mounted on a board. The semiconductor device may include: junction regions formed on upper portions of both sidewalls of a trench formed in a semiconductor substrate; a first gate electrode buried in the trench and having a stepped upper surface; and a second gate electrode formed on the first gate electrode and including a lower portion that to overlaps the first junction region.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Figure 1:
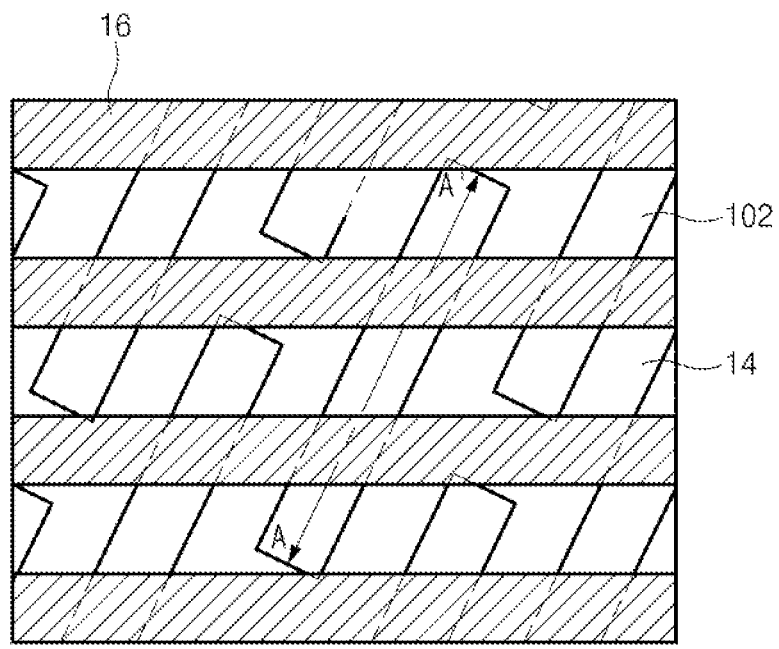
FIG. 1 is a plan view illustrating a $6F^2$ structure according to an embodiment of the present invention.

Embodiments of the present invention are described below in greater detail with reference to the accompanying drawings.

Embodiments are described herein with reference to cross-sectional illustrations that are schematic illustrations of embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present.

In embodiments of the present invention, a first gate electrode formed of tungsten and a second gate electrode formed of polysilicon so that a connection between a junction region and a metal gate electrode is minimized, thereby improving GIDL. In addition, gate resistance may be reduced to improve device characteristics and reliability. Embodiments of the present invention may be applied to electronic devices or systems that use semiconductor technology.

Hereinafter, embodiments of the present invention will be described in detail with reference to FIGS. 1 to 11.

Figure 2:
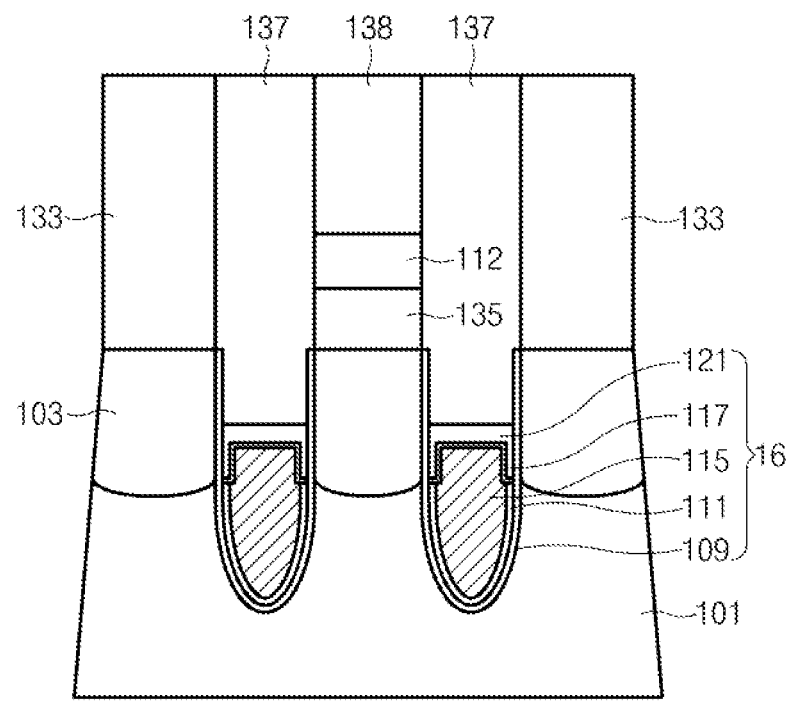
FIG. 2 is a cross-sectional view illustrating a semiconductor device taken along line A-A' of FIG. 1 according to an embodiment of the present invention.

FIG. 1 is a plan view illustrating a $6F^2$ structure according to an embodiment of the present invention, and FIG. 2 is a cross-sectional view illustrating a semiconductor device taken along line A-A' of FIG. 1 according to a first embodiment.

Referring to FIGS. 1 and 2, a device isolation layer 14 defining an active region 102 is formed in a predetermined region of a semiconductor substrate 101, and a buried gate 16 runs through the active region 102 and the device isolation layer 14. In an embodiment, the buried gate 16 may include a conductive material such as titanium (Ti), titanium nitride (TiN), tungsten (W), or tungsten nitride (WN) and polysilicon.

The active region 102 is arranged not to cross the buried gate 16 at an oblique (non-normal) angle. A gate insulating layer 109, which may be an oxide layer, is formed between the buried gate 16 and the active region 102. In an embodiment, the gate insulating layer 109 may be formed of a silicon oxide ($SiO_2$), or a high-k material with a dielectric constant higher than silicon oxide ($SiO_2$).

As shown in FIG. 2, in the first embodiment, buried gate 16 buried in the semiconductor substrate 101. Buried gate 16 has a structure in which the gate insulating layer 109 and a barrier metal layer 111 are sequentially stacked in a trench, a first gate electrode 115 is disposed over the metal barrier layer 111 in a lower portion of the trench, a barrier layer 117 is disposed over the first gate electrode 115, and a second gate electrode 121 is disposed over the barrier layer 117.

The first gate electrode 115 has a stepped upper surface, where a central portion protrudes above lower side portions. The second gate electrode 121 is disposed over the first gate electrode, including spaces between the protruding central portion and sidewalls of the trench. In the first embodiment, the first gate electrode 115 has a symmetrically stepped top-hat shaped structure (⊓) in which upper surfaces of both side portions "A" of first gate electrode 115 are disposed below the upper surface of the central protruding portion, as shown in FIG. 2. Furthermore, in an embodiment, upper surfaces of the both side portions A do not substantially overlap the adjacent junction region 103, and an upper surface of the central portion B overlaps the junction region 103. The first gate electrode 115 may be formed of a metal material such as tungsten (W), and the second gate electrode 121 may be formed of an $N^+$ polysilicon material.

In an embodiment, a barrier layer 117 is formed of a metal layer containing nitrogen and disposed between the first gate electrode 115 and the second gate electrode 121 to reduce contact resistance between the first gate electrode 115 and the second gate electrode 121. A nitride layer 137 is formed on the buried gate 16, a storage node contact 133 using the nitride layer 137 as a sidewall is formed, and a bit line contact 135 is formed between the buried gates 16. A bit line 112 is formed over the bit line contact 135, and a nitride layer 138 is formed over the bit line 112.

As described above, in the first embodiment, the second gate electrode 121 has a structure including lower side portions that are disposed between the central portion B of the first electrode and sidewalls of the trench. The lower side portions of the second gate electrode 121 may overlap with an adjacent junction region 103. Structures such as storage nodes, bit line contacts, and the like may be disposed over the buried gate structures. Next, a method of fabricating a semiconductor device according to the second embodiment of FIG. 2 will now be explained with reference to FIGS. 3A to 3G.

Figure 3A:
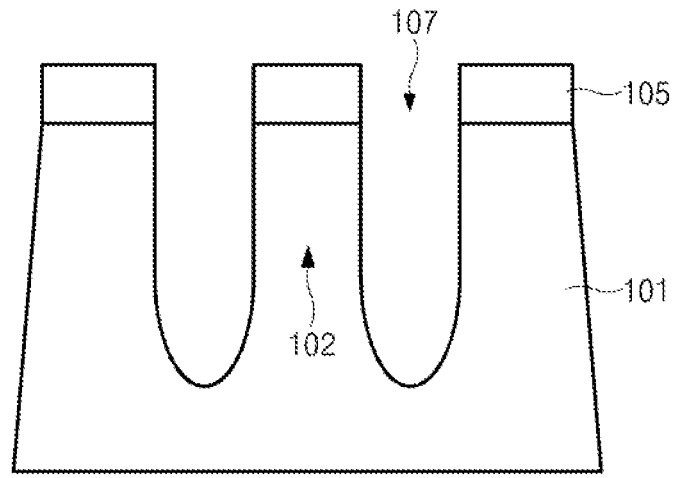
FIGS. 3A to 3G are cross-sectional views illustrating a method of fabricating the semiconductor device according to a first embodiment of the present invention.

First, as shown in FIG. 3A, a hard mask layer 105 is formed on a semiconductor substrate 101 in which an active region 102 is defined by a device isolation layer (not shown). Then, the trench 107 is formed in the semiconductor substrate 101 using the hard mask layer 105 as a mask. In an embodiment, the trench 107 may be formed to have a depth of 1500 Å.

Figure 3B:
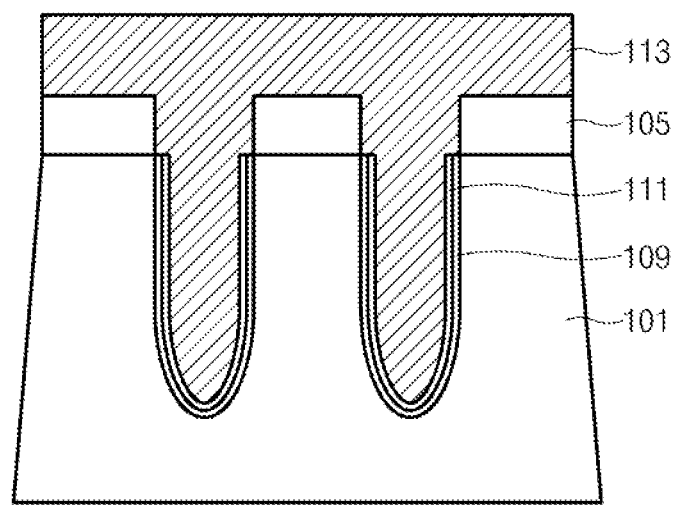

As shown in FIG. 3B, a gate insulating layer 109 and a barrier metal layer 111 are sequentially deposited over surfaces of the trench and along the step of the hard mask layer 105, and then an etch back process is performed to remove portions of the gate insulating layer 109 and the barrier metal layer 111 disposed on the upper surface and sides of the hard mask layer 105. A first gate material 113 is deposited over the entire exposed surface of the semiconductor device to a depth sufficient to fill the trench 107.

The gate insulating layer 109 protects silicon a surfaces of the semiconductor substrate 101, and may be formed by depositing a high-K material such as silicon oxide ($SiO_2$), oxide-nitride-oxide (ONO), hafnium oxide ($HfO_2$), or zirconium oxide (ZrO) or a PZT material using a chemical vapor deposition (CVD) method or a method of heating the semiconductor substrate in a furnace. Alternatively, the gate insulating layer 109 may be formed by depositing a high-K material such as zirconium (Zr) or hafnium (Hf) on an inner surface of the trench 107 by an atomic layer deposition (ALD) method and then natively oxidizing the high-K material.

The barrier metal layer 111 may be formed between the gate insulating layer 109 and the first gate material 113 to increase an adhesion force between the gate insulating layer 109 and the first gate material 113. The barrier metal layer 111 may be formed of a single material layer such as a Ti layer or a TiN layer, or a combination of material layers.

The first gate material 113 may be formed of tungsten (W), titanium (Ti), aluminum (Al), tantalum (Ta), tungsten nitride (WNx), aluminum nitride (AlNx), titanium nitride (TiNx), tungsten silicide (WSix), titanium silicide (TiSix), or cobalt silicide (CoSix), and formed of a single layer or a combination of material layers.

Figure 3C:
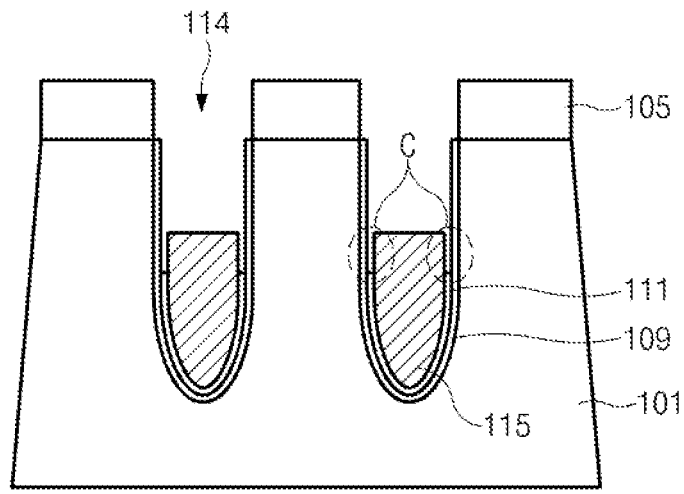

As shown in FIG. 3C, the first gate material 113 is planarized, and then an etch back process is performed to remove portions of the barrier metal layer 111 and the first gate material 113.

Figure 3D:
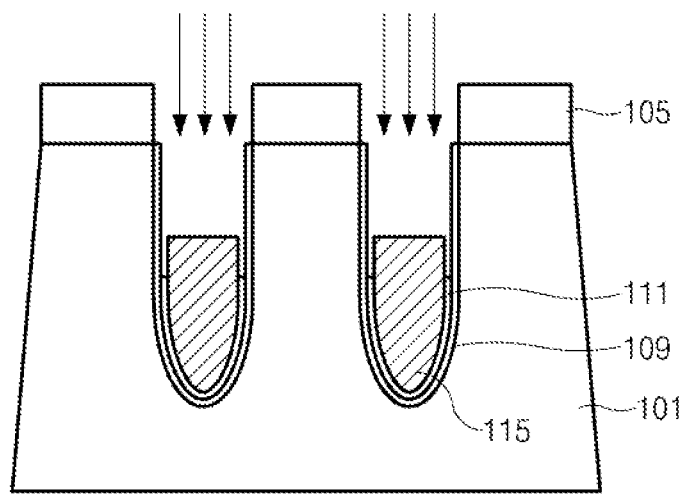

Therefore, the gate insulating layer 109, the barrier metal layer 111, and a first gate electrode 115 are formed in a lower portion of the trench 107, and the gate insulating layer 109 remains over the entire sidewall of trench 114. A portion of the barrier metal layer 111 on an upper sidewall of the first gate electrode 115 is further etched to form a space between the first gate electrode 115 and the barrier metal layer 111 (see C of FIG. 3C). In an embodiment, the first gate electrode 115 and the barrier metal layer 111 may be formed so that the first gate electrode 115 has a height of 700 Å, the trench 114 over the first gate electrode 115 has a height of 800 Å, and the space between the gate electrode 115 and the barrier metal layer 111 may have a thickness of 100 Å. As shown in FIG. 3D, nitrogen ions are implanted into an upper portion of the first gate electrode 115 in the trench 114.

Figure 3E:
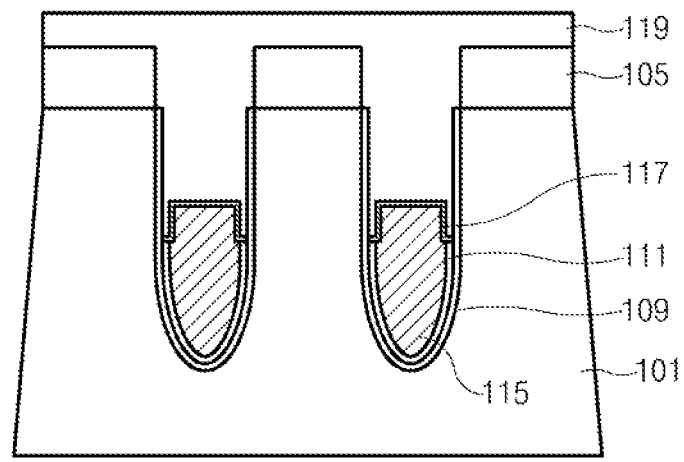

As shown in FIG. 3E, a barrier layer 117 is formed over the stepped upper surface of first gate electrode 115 and an exposed portion of the barrier metal layer 111. In an embodiment, the thickness of barrier metal layer 111 is greater than the thickness of the barrier layer 117, so that the spaces between the central protrusion of first gate electrode 115 and sidewalls of the trench 114 are large enough to accommodate both the barrier layer 117 and portions of the subsequently formed second gate electrode 121. Next, a second gate material 119 is deposited over the entire upper surface of the semiconductor device including the barrier layer 117 and the hard mask layer 105 with a thickness sufficient to fill trench 114. In an embodiment, the second gate material 119 may be formed of an N$^+$-doped polysilicon material.

Figure 3F:
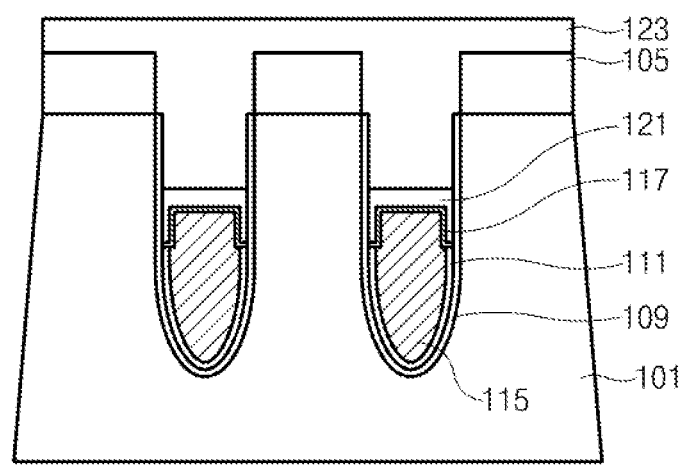

As shown in FIG. 3F, the second gate material 119 is planarized and then etched back so that a second gate electrode 121 is formed over barrier layer 117. Therefore, the lower surface of second gate electrode 121 has a stepped lower surface that matches with the stepped upper surface of first gate electrode 115. The second gate electrode 121 is formed over both sidewall portions of the trench 114 adjacent to junction regions and on the barrier layer 117.

A sealing layer 123 is deposited on the entire surface of the semiconductor device including the second gate electrode 121 and the hard mask layer 105. The sealing layer 123 may be formed of a nitride layer and is planarized.

Figure 3G:
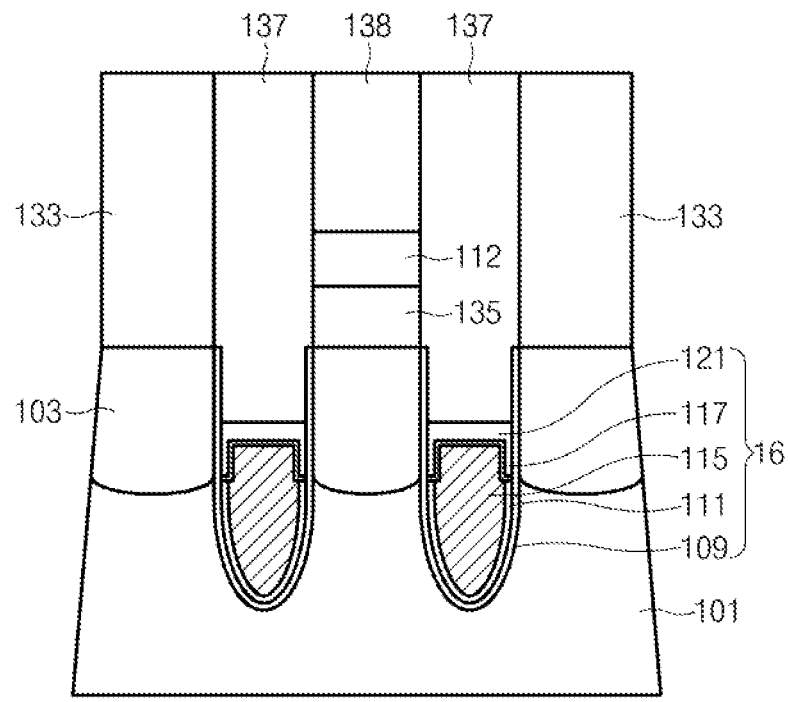

Subsequently, as seen in FIG. 3G, the hard mask layer 105 and the sealing layer 123 are removed, the junction region 103 is formed in an active region between the buried gates 16, and then a nitride layer 137 is formed on the buried gate 16, a storage node contact 133 using the nitride layer 137 as a sidewall is formed, and a bit line contact 135 is formed on a portion of the semiconductor substrate between the buried gates 16. A bit line 112 is formed over the bit line contact 135, and a nitride layer 138 is formed over the bit line 112.

As described above, in the first embodiment, the metal-based first gate electrode 115 with a stepped upper surface is formed in a lower portion of the buried gate 16 and the second gate electrode 121, which may be formed of N$^+$-doped polysilicon, is formed on the first gate electrode 115 so that the second gate electrode 121 is disposed between a central portion of the first gate electrode 115 and sidewalls of the trench 114 adjacent to junction regions. Therefore, while maintaining an overlapping region between the junction region and the buried gate, GIDL can be improved.

Figure 4:
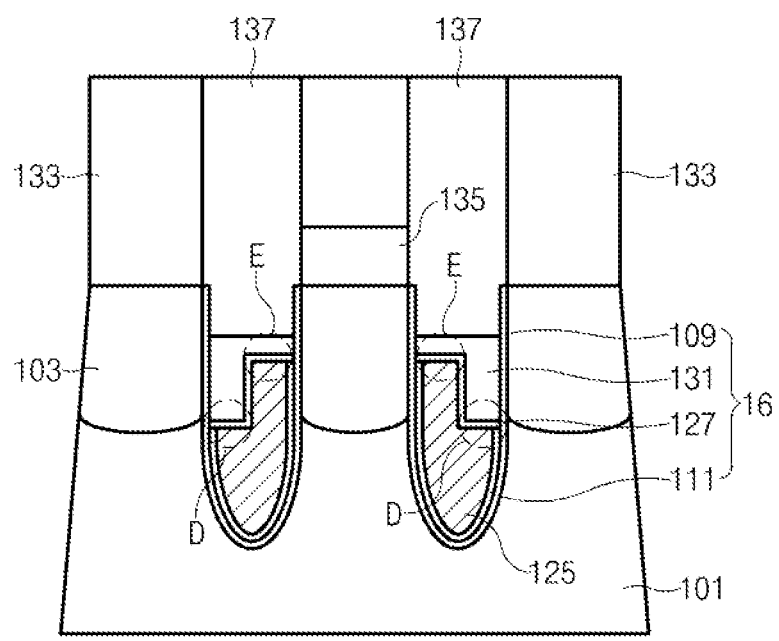
FIG. 4 is a cross-sectional view illustrating a semiconductor device taken along line A-A' of FIG. 1 according to a second embodiment of the present invention.
Figure 5A:
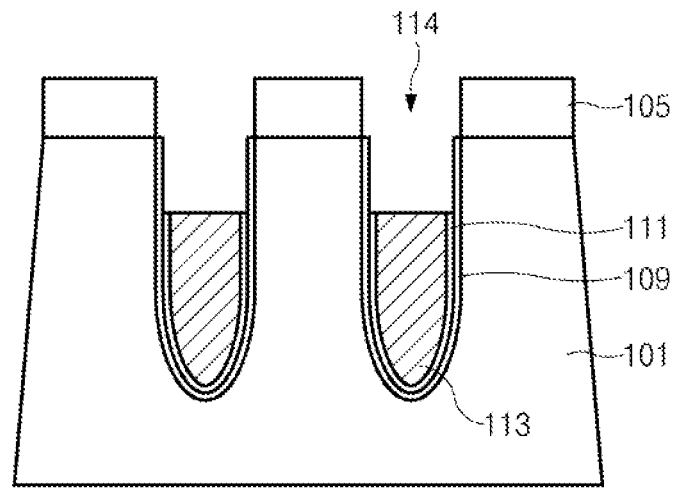
FIGS. 5A to 5G are cross-sectional views illustrating a method of fabricating the semiconductor device according to the second embodiment of the present invention.
Figure 5B:
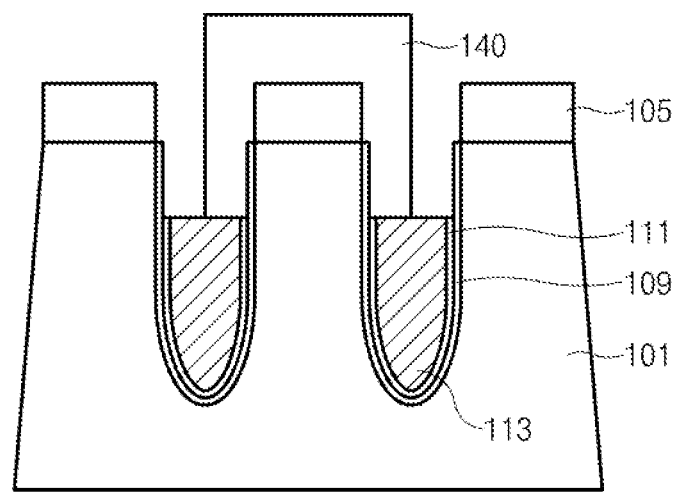
Figure 5C:
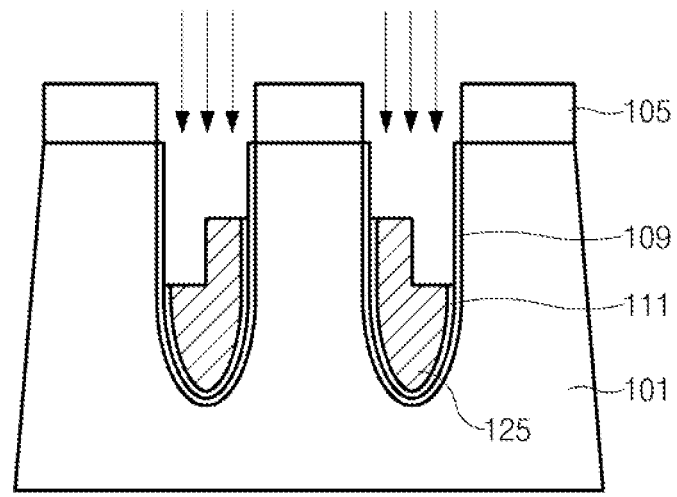
Figure 5D:
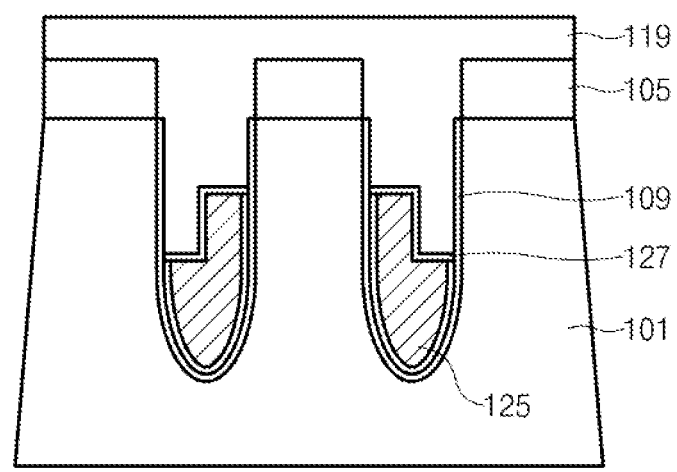
Figure 5E:
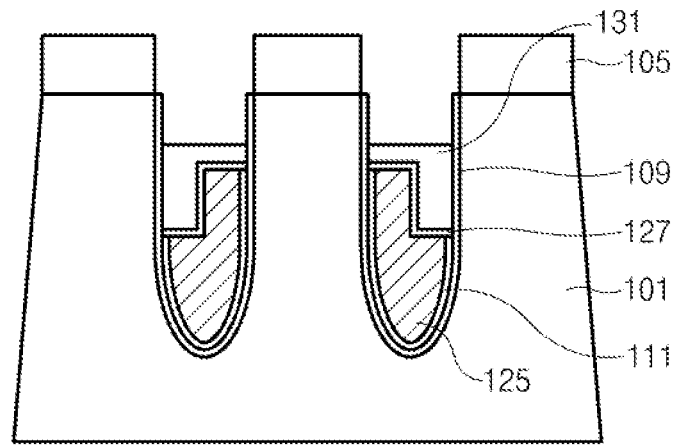
Figure 5F:
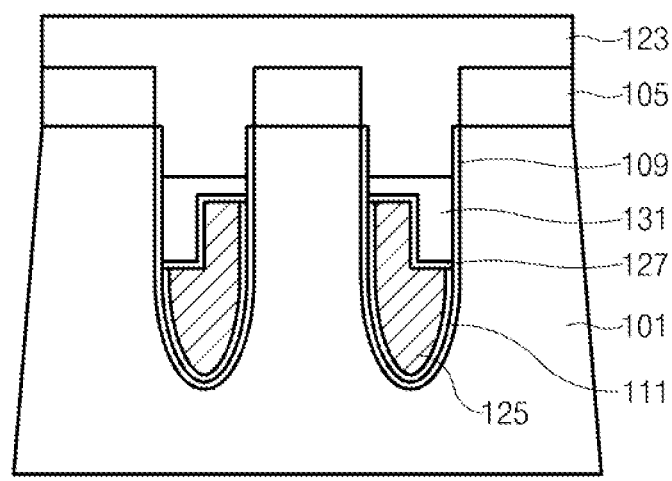
Figure 5G:
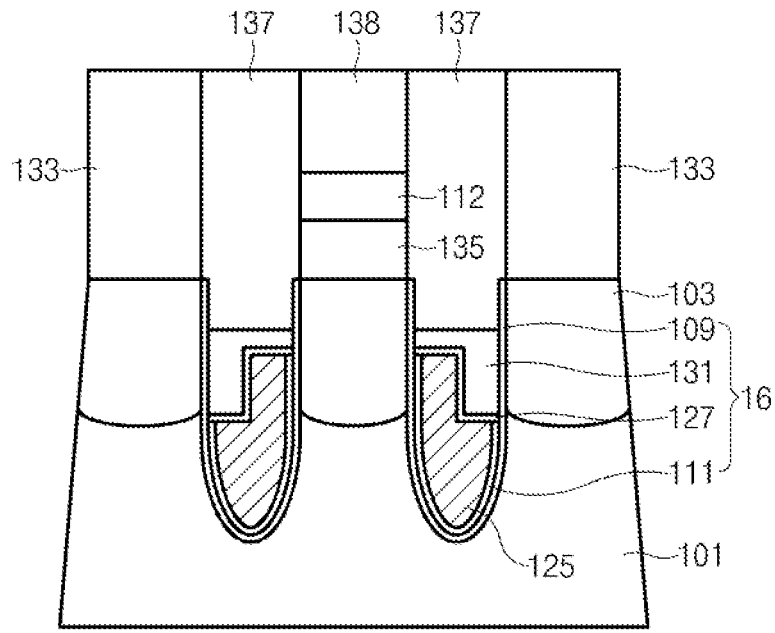

In an embodiment, a bit line contact is formed over a channel region between buried gates, and storage node contacts are formed on the side of the gates opposite the channel region, as seen in FIG. 4 and FIG. 5G. FIG. 4 is a cross-sectional view illustrating a structure of a semiconductor device according to a second embodiment of the present invention.

As shown in FIG. 4, in the semiconductor device according to the second embodiment, a buried gate 16 is formed in a semiconductor substrate 101. The buried gate 16 has a structure in which a gate insulating layer 109 and a barrier metal layer 111 are sequentially stacked in a trench, a first gate electrode 125 is formed on the barrier metal layer 111, a barrier layer 127 is formed on the first gate electrode 125, and a second gate electrode 131 is formed on the barrier layer 127. A nitride layer 137 is formed on the buried gate 16, a storage node contact 133 using the nitride layer 137 as a sidewall is formed, and a bit line contact 135 is formed between the buried gates 16. A bit line 112 is formed over the bit line contact 135, and a nitride layer 138 is formed over the bit line 112.

The first gate electrode 125 has a stepped upper surface with a single step. The first gate electrode 125 has an asymmetrically stepped structure) (⌐) so that an upper surface D of a region adjacent to the storage node contact 133 has a height lower than an upper surface E of a region adjacent to the bit line contact 135. The first gate electrode 125 is formed so that the upper surface D of the region adjacent to the storage node contact 133 does not substantially overlap the junction regions 103 and the upper surface E of the region adjacent to the bit line contact 135 has a height to overlap the junction regions 103. In an embodiment, the first gate electrode 125 may be formed of a metal material such as tungsten (W) and the second gate electrode 131 may be formed of an N$^+$-doped polysilicon material.

Embodiments may include a barrier layer 127, which is a metal layer containing nitrogen and disposed between the first gate electrode 125 and the second gate electrode 131 to reduce contact resistance between the first gate electrode 125 and the second gate electrode 131.

As described above, in the second embodiment, the first gate electrode 125 has a single step and the second gate electrode 131 has a lower portion extending down along the sidewall of the trench adjacent to the storage node contact 133. That is, the first gate electrode 125 has an upper portion extending up along the sidewall of the trench adjacent to the bit line contact 135, which is less related to retention time, and the second gate electrode 131 includes a lower portion extending down along the opposing sidewall of the trench adjacent to the storage node contact 133.

Hereinafter, a method of fabricating the semiconductor device according to the second embodiment will be described with reference to FIGS. 5A to 5G.

To form a semiconductor device according to the second embodiment, as shown above in FIGS. 3A and 3B, a trench 107 is formed in a semiconductor substrate 101, a gate insulating layer 109 and a barrier metal layer 111 are formed within the trench 107, and a first gate material 113 is deposited to fill the trench.

As shown in FIG. 5A, the first gate material 113 is planarized and then etched back to remove portions of the barrier metal layer 111 and the first gate material 113. Therefore, the gate insulating layer 109, the barrier metal layer 111, and the first gate material 113 remain below a trench 114 and the gate insulating layer 109 remains on sidewalls of an upper portion of the trench 114. In an embodiment, the thickness of the first gate material 113 below the trench 114 may be 1200 Å.

As shown in FIG. 5B, a photoresist layer 140 is formed on one side of the first gate material 113 in the trench 114. The photoresist layer 140 may extend across a bit line contact region where a bit line contact 135 is subsequently formed, and over portions of first gate material 113 adjacent to the bit line contact region.

As shown in FIG. 5C, an etching process is performed using the photoresist layer 140 as a mask to etch portions of the first gate material 113 and the barrier metal layer 111 so that a first gate electrode 125 having a step is formed. In an embodiment, the height of the step of the first gate electrode 125 is about 300 Å. Then, nitrogen ions are implanted into an upper portion of the first gate electrode 125 having the step.

As shown in FIG. 5D, a barrier layer 127 is formed over the step through nitrogen ion implantation. Next, a second gate material 119 is deposited over the surface of the semiconductor including on the stepped barrier layer 127 and hard mask layer 105. As shown in FIG. 5E, the second gate material 119 is planarized and then etched back so that the upper surface of the second gate material is level across the trench, and thus a second gate electrode 131 is formed. The second gate electrode 131 has a lower portion extending down along a sidewall of the buried gate adjacent to a corresponding storage node contact region.

As shown in FIG. 5F, a sealing layer 123 is deposited on the upper surface of the semiconductor device including the second gate electrode 131 and the hard mask layer 105. Subsequently, as seen in FIG. 5G, the hard mask layer 105 and the sealing layer 123 is removed, the junction region 103 is formed in active region between the buried gates 16, and then a nitride layer 137 is formed on the buried gate 16, a storage node contact 133 using the nitride layer 137 as a sidewall is formed, and a bit line contact 135 is formed on a portion of the semiconductor substrate between the buried gates 16.

In an embodiment, a metal gate electrode (first gate electrode) having a high work function is used in a channel region and an $N^+$-doped polysilicon gate electrode (second gate electrode) having low work function relative to the metal gate electrode material is applied to a region overlapping the junction region so that GIDL can be improved, while the overlapping region between the junction region and the gate electrode is formed to a sufficient depth and gate resistance is minimized to prevent the current drivability from being degraded.

Further, the barrier layer is formed between the metal gate electrode (first gate electrode) and the $N^+$-doped polysilicon gate electrode (second gate electrode) through the nitrogen ion implantation to reduce the contact resistance between the metal gate electrode and the $N^+$-doped polysilicon gate electrode.

Figure 6:
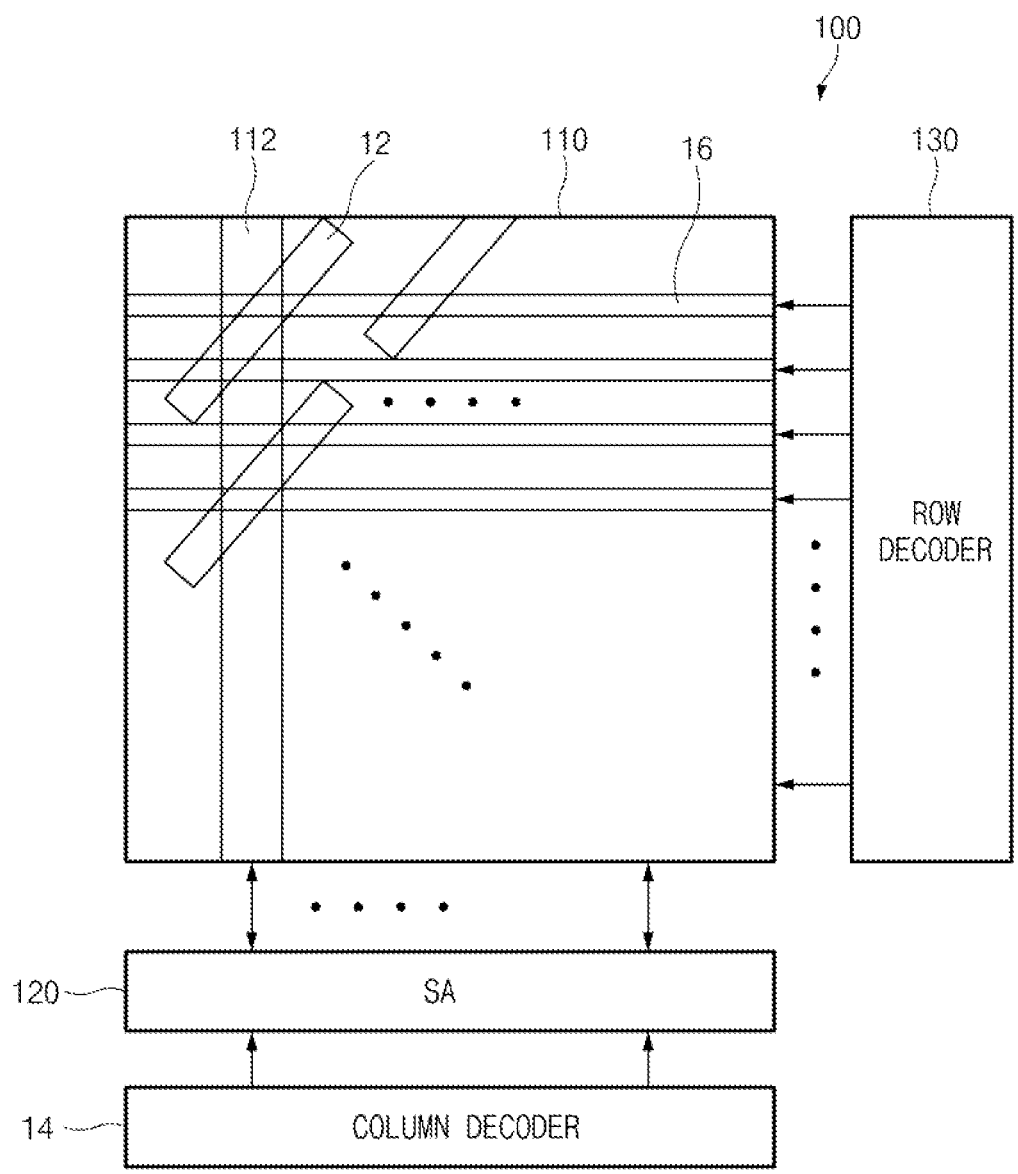
FIG. 6 is a view illustrating a configuration in which a structure of a semiconductor device is expanded to a peripheral circuit area according to embodiments of the present invention.

FIG. 6 is a configuration view illustrating a structure of a semiconductor device expanded to a peripheral circuit area according to embodiments of the present invention. For clarity, the numerals in FIG. 6 denote like elements of FIGS. 1 and 3.

A semiconductor device 10 includes a cell array 11, a sense amplifier 12, a column decoder 13, and a row decoder 14.

The cell array 11 includes a plurality of memory cells (not shown) connected to bit lines 15 and word lines (buried gates) 16. Each of the memory cells has a structure in which the gate 16 is buried in an active region. In particular, a capping insulating layer, which caps the buried gates 16 to isolate the buried gates 16 in each memory cell, includes a first capping nitride layer in which a ratio of nitrogen to silicon is controlled through nitrogen implementation, a capping oxide layer in which a portion of the first capping nitride layer is oxidized, and a second capping nitride layer disposed on the capping oxide layer, in which a ratio of nitrogen to silicon is controlled through nitrogen implementation.

The sense amplifier 12 is connected to the bit lines 15 and configured to sense and amplifier data stored in memory cells of the cell array 11.

The row decoder 13 is connected to the word lines (buried gates) and configured to generate a signal for selectively activating the memory cells of the cell array 11 and applying the signal to the selected specific word line (buried gate) 16.

The column decoder 14 is configured to generate a driving signal for operating the sense amplifier 12 connected to a corresponding cell selected by the row decoder 13 and output the driving signal to the sense amplifier 12.

The semiconductor device of FIG. 6 may be used in a computing memory (for example, dynamic random access memory (DRAM), static random access memory (SRAM), double data rate (DDR)3 synchronous DRAM (SDRAM), DDR2 SDRAM, DDR SDRAM, or single data rate (SDR) SDRAM), a consumer memory (for example, DDR3 SDRAM, DDR2 SDRAM, DDR SDRAM, or SDR SDRAM), a graphic memory (for example, DDR2 SDRAM, DDR3 SDRAM, DDR4 SDRAM, or DDR5 SDRAM), a mobile memory, and the like.

Figure 7:
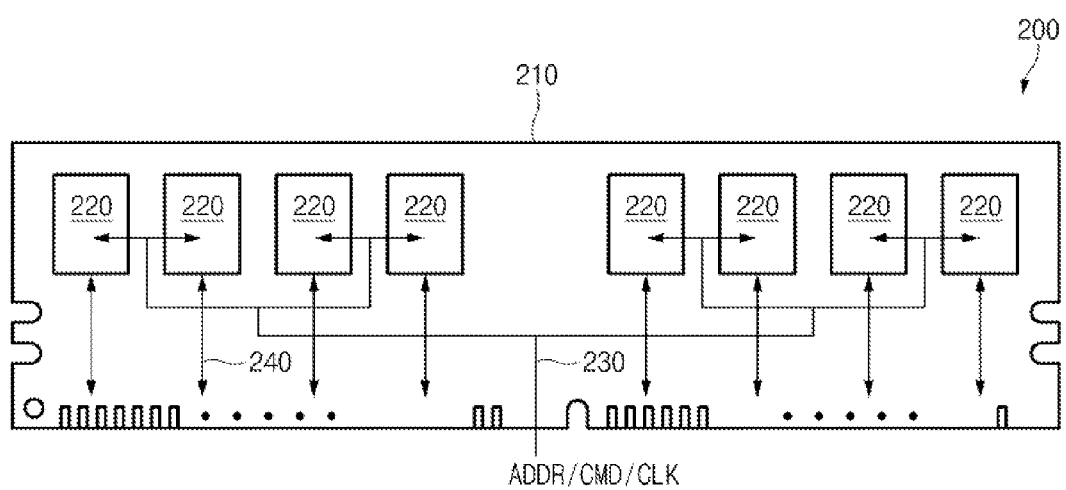
FIG. 7 is a view illustrating a configuration of a semiconductor module according to embodiments of the present invention.

FIG. 7 is a view illustrating a configuration of a semiconductor module according to embodiments of the present invention.

The semiconductor module 200 includes a plurality of semiconductor devices 220 mounted on a module board 210, a command link 230 configured to allow the semiconductor devices 220 receive a control signal (address signal (ADDR), command signal (CMD), and clock signal (CLK)) from an external controller (not shown), and a data link 240 connected to the semiconductor devices 220 and configured to transmit input/output data to/from the semiconductor devices.

In an embodiment, each of the semiconductor devices 220 includes the semiconductor device 100 illustrated in FIG. 6. That is, the semiconductor device 220 has a structure in which gates are buried in an active region. In addition, the devices may include a capping insulating layer, which is disposed on the buried gates to isolate the buried gates. The capping insulating layer may include a first capping nitride layer in which a ratio of nitrogen to silicon is controlled through nitrogen implementation, a capping oxide layer in which a portion of the first capping nitride layer is oxidized, and a second capping nitride layer disposed on the capping oxide layer, in which a ratio of nitrogen to silicon is controlled through nitrogen implementation.

The command link 230 and the data link 240 may be formed to be identical with or similar to those used in the conventional semiconductor modules.

FIG. 7 shows eight semiconductor devices 220 mounted on a front surface of the module board 210, but the semiconductor devices 220 may be mounted on a rear surface of the module board 210 as in FIG. 7. That is, the semiconductor devices 220 may be mounted in one side or both sides of the module board 210 and the number of semiconductor devices 220 to be mounted is not limited to the number of mounted semiconductor devices 220 of FIG. 7. Further, a material and structure of the module board 210 are not specifically limited by the scope of this disclosure.

Figure 8:
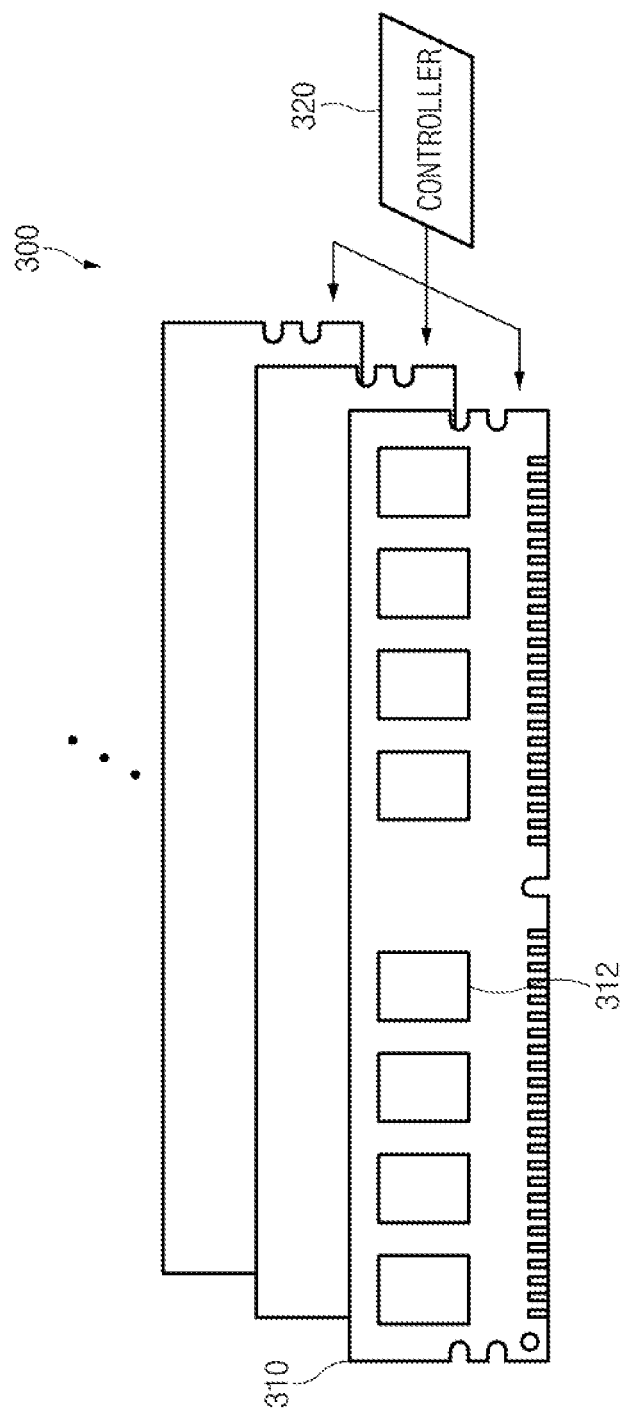
FIG. 8 is a view illustrating a configuration of a semiconductor system according to embodiments of the present invention.

FIG. 8 is a view illustrating a configuration of a semiconductor system according to embodiments of the present invention.

A semiconductor system 300 includes at least one semiconductor module 310 on which a plurality of semiconductor devices 312 are mounted, and a controller 320 configured to provide an bidirectional interface between the semiconductor devices 312 and external systems (not shown) and control an operation of the semiconductor module 310.

The controller 320 may be formed so that the function is the same as or similar to a controller configured to control operations of a plurality of semiconductor modules in the conventional data processing system. Thus, a detailed description thereof will be omitted.

In an embodiment, the semiconductor module 200 illustrated in FIG. 7 may be used as the semiconductor module 310.

Figure 9:
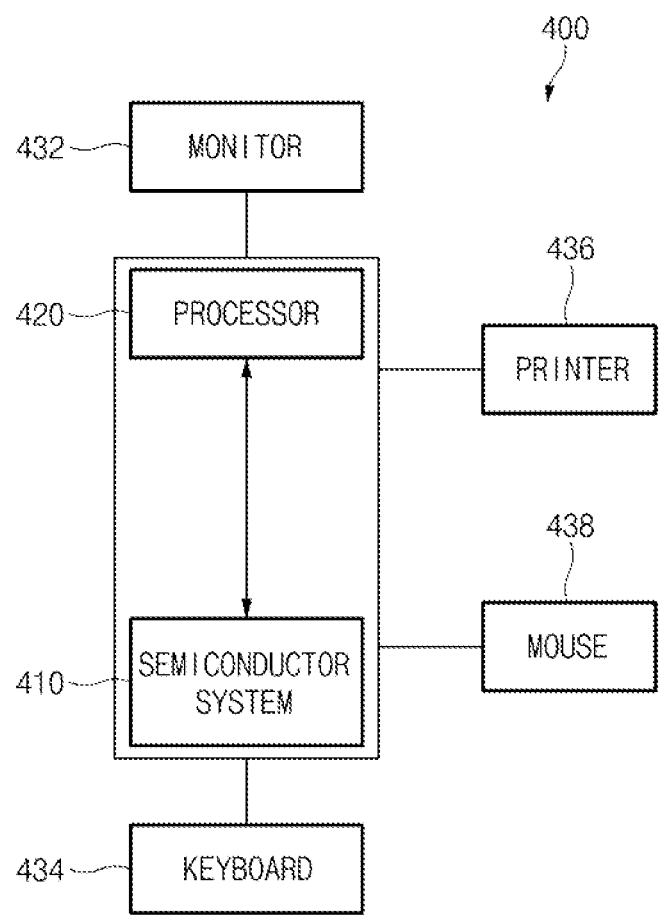
FIG. 9 is a view illustrating a structure of a computer system according to embodiments of the present invention.

FIG. 9 is a view illustrating a structure of a computer system according to embodiments of the present invention.

A computer system 400 includes a semiconductor system 410 and a processor (CPU) 420.

The semiconductor system 410 stores data for controlling operations of the computer system 400. In an embodiment, the semiconductor system 300 illustrated in FIG. 8 may be used as the semiconductor system 410. The semiconductor system 410 includes at least one semiconductor module. A semiconductor device included in the semiconductor module has a structure in which gates are buried in an active region. A capping insulating layer, which is disposed on the buried gates to isolate the buried gates, may include a first capping nitride layer in which a ratio of nitrogen to silicon is controlled through nitrogen implementation, a capping oxide layer in which a portion of the first capping nitride layer is oxidized, and a second capping nitride layer disposed on the capping oxide layer, in which a ratio of nitrogen to silicon is controlled through nitrogen implementation.

The processor 420 processes data stored in the semiconductor system 410 and controls an operation of the computer system 400. The processor 420 may be formed so that the function of the processor 420 is the same as or similar to a central processing unit used in the conventional computer system.

The computer system 400 may include user interface devices such as a monitor 432, a keyboard 434, a printer 436, and a mouse 438.

Figure 10:
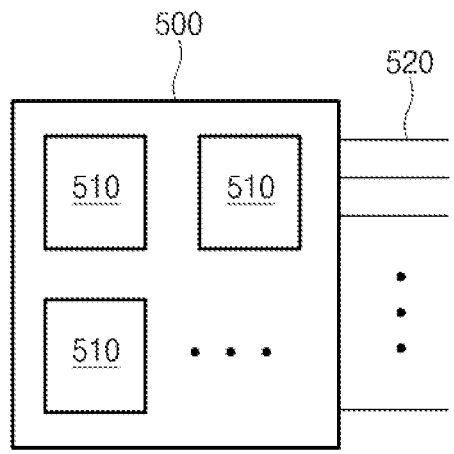
FIG. 10 is a view illustrating a configuration of a data processing system according to embodiments of the present invention.

FIG. 10 is a view illustrating a configuration of a data processing system according to an embodiment of the present invention.

A data processing system 500 is provided in an electronic system (not shown) and performs particular functions among various functions of the electronic system.

The data processing system 500 includes at least one semiconductor device 510 mounted on a board.

The semiconductor device 510 includes a cell array (not shown) which stores data used to perform specific functions of the electronic system and a processor (not shown) configured to process data stored in the cell array and control the electronic system to perform the specific functions. That is, the semiconductor device 510 includes a unit configured to store data in one unit chip (a die or chip) and a unit configured to process the stored data and perform the specific function of the electronic system. The cell array may include a plurality of memory cells connected to bit lines and word lines. The memory cells have a structure in which gates are buried in an active regions, and a capping insulating layer, which is disposed on the buried gates to isolate the buried gates, include a first capping nitride layer in which a ratio of nitrogen to silicon is controlled through nitrogen implementation, a capping oxide layer in which a portion of the first capping nitride layer is oxidized, and a second capping nitride layer disposed on the capping oxide layer, in which a ratio of nitrogen to silicon is controlled through nitrogen implementation.

The data processing system 500 may be connected to other elements (for example, CPU) of the electronic system through leads 520 and transmit/receive data to/from the other elements unidirectionally or bidirectionally.

Figure 11:
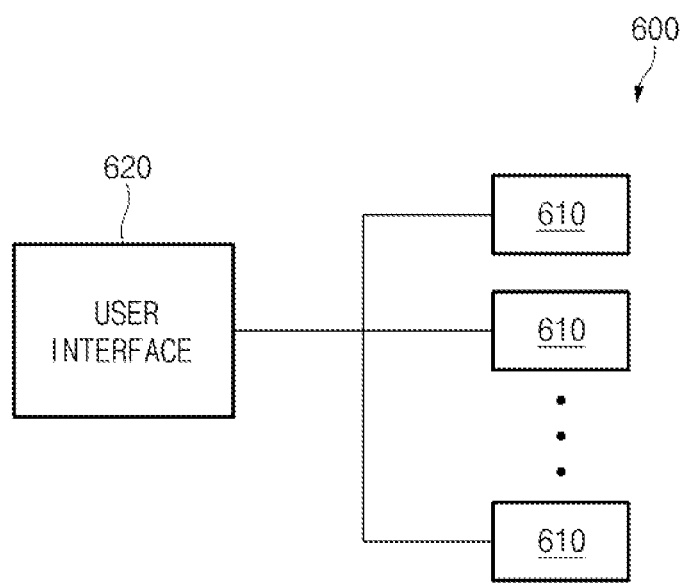
FIG. 11 is a view illustrating a configuration of an electronic system according to embodiments of the present invention.

FIG. 11 is a view illustrating a configuration of an electronic system according to embodiments of the present invention.

An electronic system 600 includes at least one data processing system 610 and a user interface 620.

The data processing system includes specific functions of the various functions of the electronic system 600 and includes at least one semiconductor device mounted on a board. The semiconductor device includes a cell array (not shown) configured to store data required to perform the specific functions of the electronic system 600 and a processor (not shown) configured to process data stored in the cell array and perform corresponding functions. The cell array includes a plurality of memory cells connected to bit lines and word lines (buried gates). The memory cells have a structure in which the gates are buried in active region and a capping insulating layer, which is disposed on the buried gates to isolate the buried gates, including a first capping nitride layer in which a ratio of nitrogen to silicon is controlled through nitrogen implementation, a capping oxide layer in which a portion of the first capping nitride layer is oxidized, and a second capping nitride layer disposed on the capping oxide layer, in which a ratio of nitrogen to silicon is controlled through nitrogen implementation.

The user interface 620 provides an interface between a user and the data processing system 610. The user interface 620 may include a key pad, a touch screen, a speaker, and the like which are integrally installed to an electronic apparatus.

The electronic system 600 includes an embedded system provided in various kinds of electronic, information, and communication apparatuses such as a computer, a home appliance, a factory automation system, an elevator, and a mobile phone.

The above-described embodiments have been described using a $6F^2$ structure in which the active regions obliquely cross the word lines (gates), but the structure is only illustrative and embodiments of the present invention are not limited to the $6F^2$ structure. That is, embodiments of the present invention may be applied to all structures in which gates are buried in an active region.

In embodiments of the present invention, a GIDL characteristic may be improved while maintaining an overlapping region between a junction region and a buried gate, and gate resistance may be reduced so that device characteristics and reliability are improved.

A barrier layer may be formed between a metal gate electrode and an $N^+$-polysilicon gate electrode so that contact resistance between the gates is minimized.

While certain embodiments have been described above, the embodiments described are by way of example only. Accordingly, the devices and methods described herein should not be limited based on the described embodiments. Rather, the systems and methods described herein should only be limited in light of the claims that follow when taken in conjunction with the above description and accompanying drawings.

What is claimed is:

1. A method of fabricating a semiconductor device, the method comprising:
    etching a gate region of a semiconductor substrate to form a trench;
    forming a first gate electrode in the trench;
    etching at least one side portion of the first gate electrode to a first depth;
    forming a second gate electrode on the first gate electrode, wherein all sides of an upper portion of the first gate electrode exposed by the step of etching at least one side portion of the first gate electrode are covered with the second gate electrode; and
    forming a first junction region on a first side of the second gate electrode and a second junction region on a second side of the second gate electrode.

2. The method of claim 1, wherein etching at least one side portion of the first gate electrode to a first depth includes symmetrically etching the first gate electrode so that upper surfaces of first and second side portions of the first gate electrode adjacent to the first and second junction regions have a lower height than an upper surface of a central portion between the first and second side portions.

3. The method of claim 1, wherein etching at least one side portion of the first gate electrode to a first depth includes etching the first gate electrode so that upper surfaces of side portions of the first gate electrode adjacent to the first and second junction regions are below the first and second junction regions and an upper surface of a central portion of the first gate electrode between the first and second side portions has a height sufficient to overlap the first and second junction regions.

4. The method of claim 1, wherein etching at least one side portion of the first gate electrode to a first depth includes asymmetrically etching the first gate electrode so that an upper surface of a portion of the gate first gate electrode adjacent to a storage node contact is lower than an upper surface of a portion of the first gate electrode adjacent to a bit line contact.

5. The method of claim 1, wherein etching at least one side portion of the first gate electrode to a first depth includes etching the first gate electrode so that an upper surface of a portion of the gate first gate electrode adjacent to a storage node contact is disposed below the first junction region, an upper surface of a portion of the gate first gate electrode overlaps the second junction region, and the second junction region is a bit line contact junction region.

6. The method of claim 1, further comprising forming a gate insulating layer in the trench before forming the first gate electrode.

7. The method of claim 6, wherein forming the first gate electrode includes forming a barrier metal layer on the gate insulating layer and forming a first gate material over the barrier metal layer in the trench to form the first gate electrode.

8. The method of claim 7, wherein etching at least one side portion of the first gate electrode to a first depth includes etching at least one side portion of the barrier metal layer when the at least one side portion of the first gate electrode is etched.

9. The method of claim 1, further comprising forming a barrier layer on the first gate electrode before forming the second gate electrode.

10. The method of claim 9, wherein forming a barrier layer includes implanting nitrogen ions into an upper portion of the first gate electrode.

11. The method of claim 9, wherein forming a barrier layer includes forming a metal layer containing nitrogen.

12. The method of claim 1, wherein the first gate electrode includes metal and the second gate electrode includes polysilicon.

\* \* \* \* \*